(12) United States Patent
Watanabe et al.

(10) Patent No.: US 7,998,779 B2
(45) Date of Patent: Aug. 16, 2011

(54) SOLID-STATE IMAGING DEVICE AND METHOD OF FABRICATING SOLID-STATE IMAGING DEVICE

(75) Inventors: Naoyuki Watanabe, Kawasaki (JP); Takao Ohno, Kawasaki (JP); Susumu Moriya, Kawasaki (JP); Izumi Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 386 days.

(21) Appl. No.: 12/401,284

(22) Filed: Mar. 10, 2009

(65) Prior Publication Data

US 2009/0230493 A1 Sep. 17, 2009

(30) Foreign Application Priority Data

Mar. 11, 2008 (JP) ................................. 2008-060639

(51) Int. Cl.
*H01L 21/00* (2006.01)

(52) U.S. Cl. .......... 438/60; 356/614; 257/432; 257/435; 438/65; 438/340; 438/335

(58) Field of Classification Search .......... 257/432–435, 257/797; 356/399–401, 614
See application file for complete search history.

(56) References Cited

U.S. PATENT DOCUMENTS 6,208,407 B1 * 3/2001 Loopstra ........................ 356/399
6,476,417 B2 * 11/2002 Honda et al. .................. 257/798

FOREIGN PATENT DOCUMENTS

JP 55-160474 A 12/1980
JP 62-67863 A 3/1987

* cited by examiner

*Primary Examiner* — Gregory J Toatley
*Assistant Examiner* — Iyabo S Alli
(74) *Attorney, Agent, or Firm* — Fujitsu Patent Center

(57) ABSTRACT

A solid-state imaging device includes: a solid-state imaging element having a light-receiving area; a transparent member disposed so as to oppose the light-receiving area; a supporting member configured to support the transparent member; a first mark disposed at either an upper surface of the transparent member or an upper surface of the supporting member; and a second mark disposed at an outer side of the light-receiving area, at an upper surface of the solid-state imaging element.

14 Claims, 10 Drawing Sheets

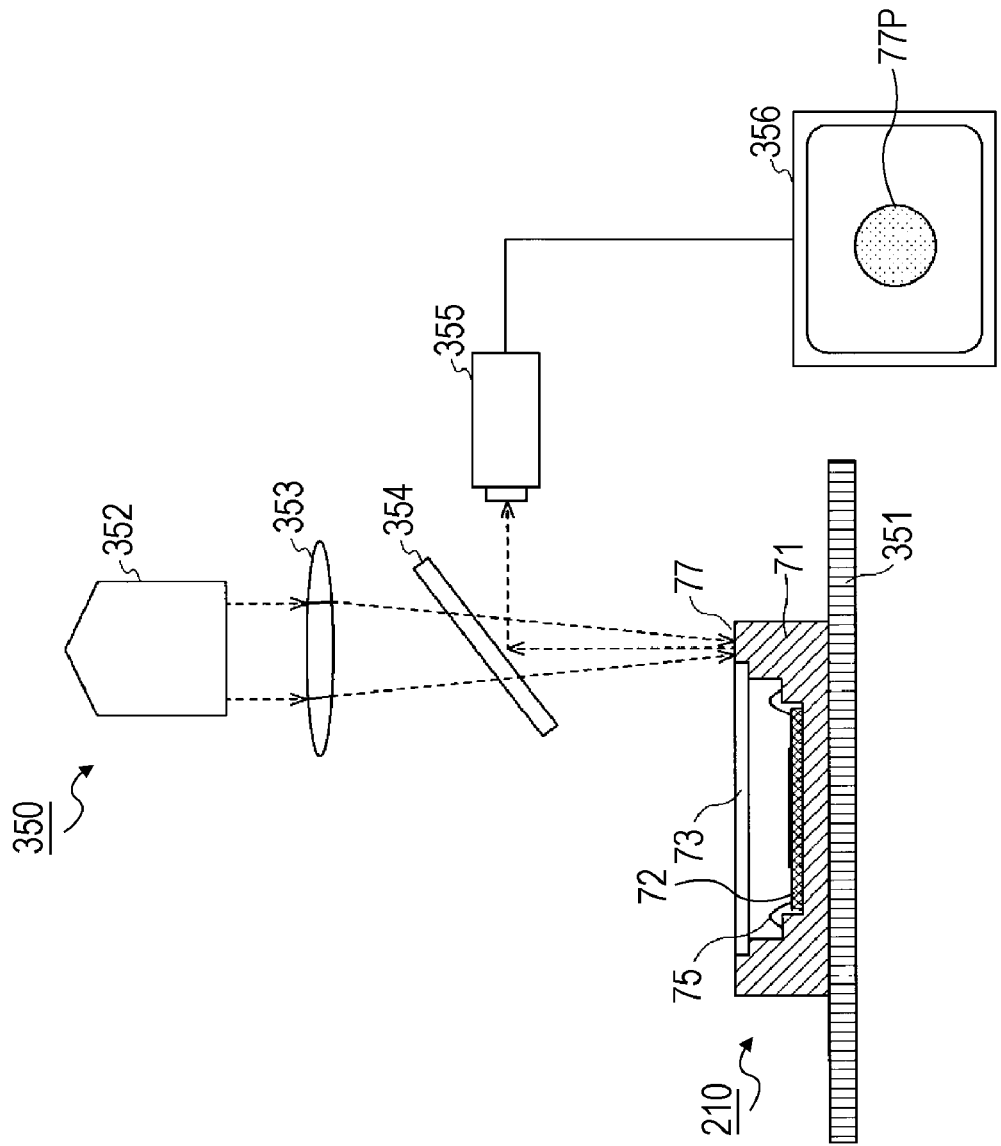

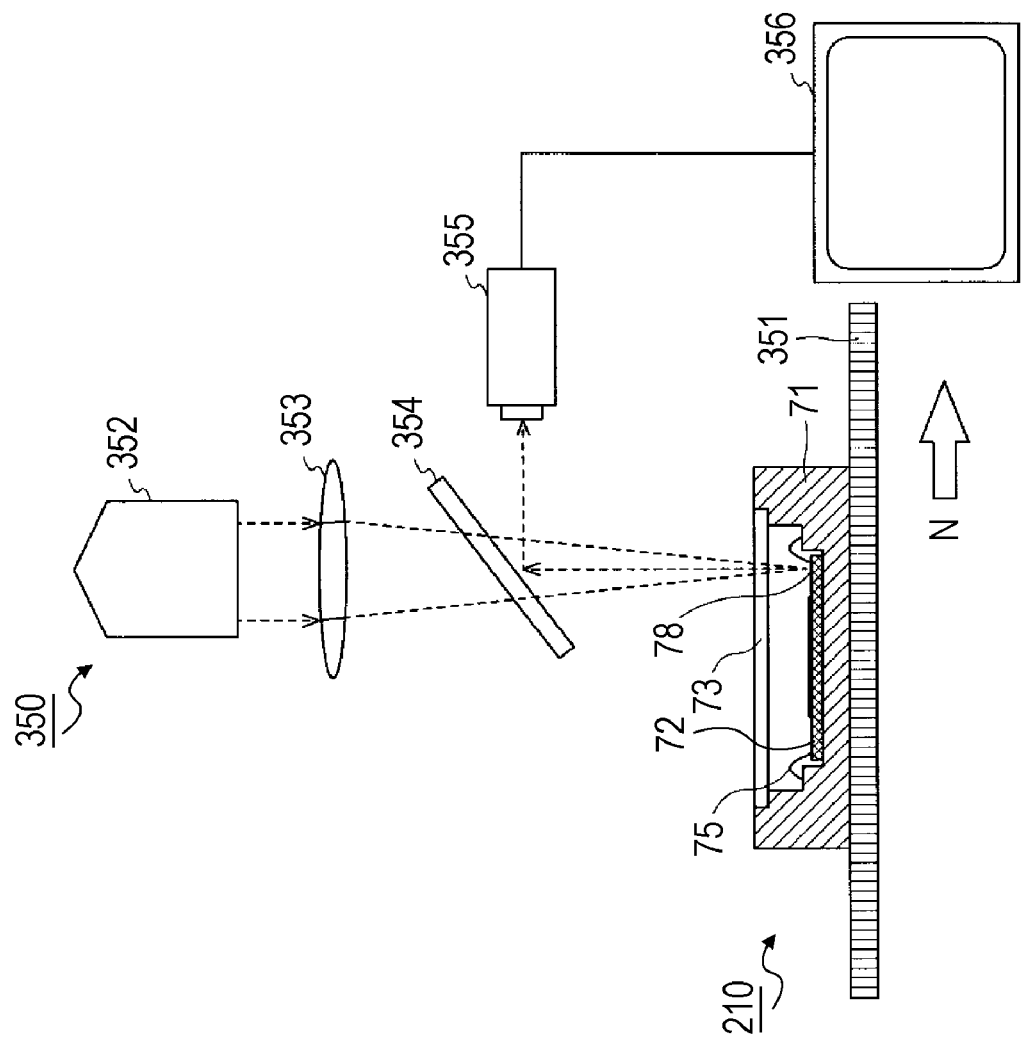

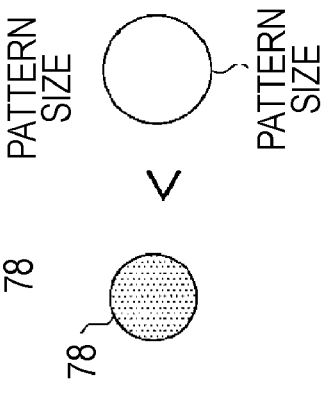
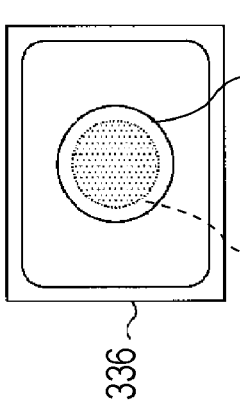
FIG. 8C   FIG. 8B   FIG. 8A
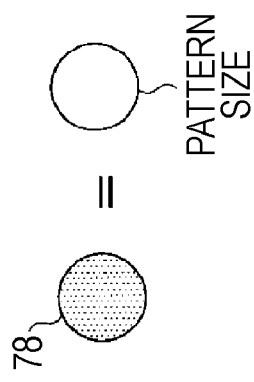
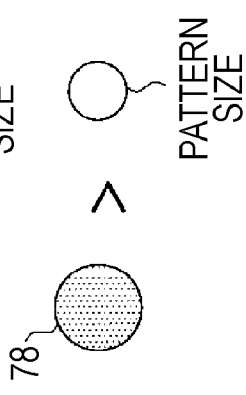
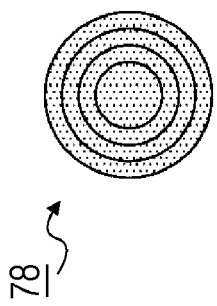
FIG. 9
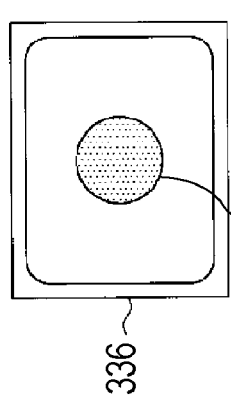

SOLID-STATE IMAGING DEVICE AND METHOD OF FABRICATING SOLID-STATE IMAGING DEVICE

CROSS-REFERENCE TO RELATED APPLICATIONS

This application is based upon and claims the benefit of priority of Japanese Patent Application No. 2008-60639, filed on Mar. 11, 2008, the entire contents of which are incorporated herein by reference.

FIELD

The present invention relates to a solid-state imaging device including a transparent member disposed on a solid-state imaging element, and to a method of fabricating the solid-state imaging device.

BACKGROUND

Japanese Unexamined Patent Application Publication No. 55-160474 discusses a fixed focus camera module. In the camera module, a solid-state image pickup element is accommodated in an accommodating container (package), and a lens unit is mounted to the upper surface of the accommodating container. The lens unit is secured to the upper surface of the accommodating container, thereby fixing a focal point of a lens held by the lens unit.

Japanese Unexamined Patent Application Publication No. 62-67863 discusses a solid-state image pickup device in which glass directly adhered to a solid-state image pickup element is sealed with resin.

SUMMARY

According to an aspect of an embodiment, a solid-state imaging device includes a solid-state imaging element having a light-receiving area; a transparent member disposed so as to oppose the light-receiving area; a supporting member configured to support the transparent member; a first mark disposed at either an upper surface of the transparent member or an upper surface of the supporting member; and a second mark disposed at an outer side of the light-receiving area, at an upper surface of the solid-state imaging element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 illustrates the method of inspecting precision of the solid-state imaging device;

FIG. 7 illustrates the method of inspecting precision of the solid-state imaging device;

FIGS. 8A to 8C each depict the relationship of a mounting-precision-inspection mark and a measurement-light pattern size with the distance between a reference surface and the upper surface of a solid-state imaging element;

FIG. 9 depicts a modification of the mounting-precision-inspection mark;

DESCRIPTION OF EMBODIMENTS

1. Structure of Solid-State Imaging Device

First Embodiment

A solid-state imaging device according to a first embodiment will be described with reference to FIGS. 1A and 1B.

Figure 1A:
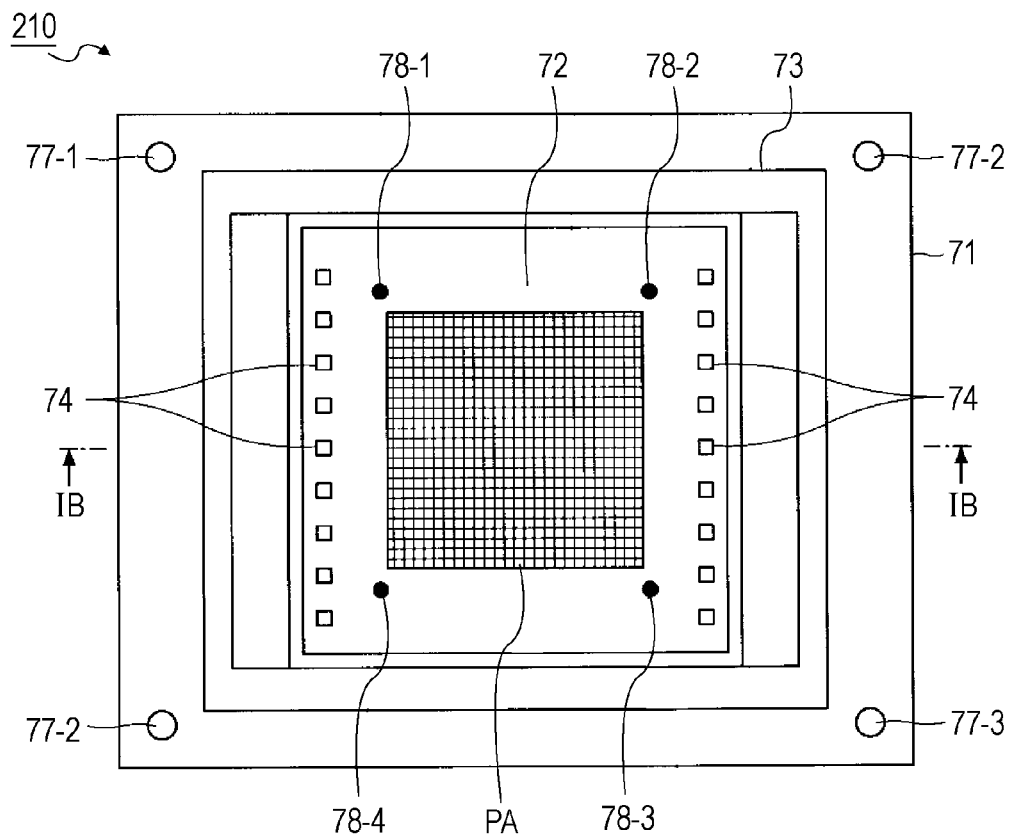
FIG. 1A is a plan view of a solid-state imaging device according to a first embodiment.

FIG. 1A is a plan view of a solid-state imaging device 210 according to the first embodiment. FIG. 1B is a sectional view taken along line IB-IB of FIG. 1A.

In the solid-state imaging device 210, a solid-state imaging element 72 is accommodated in a ceramic accommodating container (package) 71. The solid-state imaging element 72 is disposed in the ceramic accommodating container 71 with a principal surface (light-receiving area formation surface) having a light-receiving area PA thereof facing upward. The light-receiving area PA has a plurality of light-receiving elements. A transparent member 73, formed of a glass plate, is disposed above the solid-state imaging element 72. By disposing the transparent member 73, a space in which the solid-state imaging element 72 is disposed is sealed. The solid-state imaging element 72 is mounted/affixed in the interior of the ceramic accommodating container 71 through a die-bonding material (not shown).

The solid-state imaging element 72 is a charge-coupled-device (CCD) or a complementary-metal-oxide-semiconductor (CMOS) image sensor, and is formed by performing a well-known wafer process on a silicon (Si) semiconductor substrate.

Electrode pads 74 of the solid-state imaging element 72 are connected to electrode terminals (not shown) provided at the ceramic accommodating container 71 with bonding wires 75. In addition, a micro-lens 76 is disposed on each of the light-receiving elements formed on the light-receiving area PA of the solid-state imaging element 72. In FIG. 1A, the bonding wires 75 are not shown.

The transparent member 73 is disposed above the solid-state imaging element 72. The upper surface (outer surface or light-incident surface) of the transparent member 73 is separated from the surface of the solid-state imaging element 72 by a specific distance DS. The upper surface (outer surface, light-incident surface) of the transparent member 73 is positioned at a height that is the same as that of the upper surface of the ceramic accommodating container 71, and serves as a reference surface (described later).

Light incident upon the solid-state imaging device 210 through the transparent member 73 from above the transparent member 73 is incident upon the light-receiving area PA (where the plurality of light-receiving elements (photodiodes) are formed) at the principal surface of the solid-state imaging element 72.

As mentioned above, silicon (Si) is used as a substrate material of the solid-state imaging element 72. Transparent plastic, crystal, quartz, sapphire, etc., may be used as the material of the transparent member 73, in addition to the glass material.

The electrodes in the ceramic accommodating container 71 to which the electrode pads 74 of the solid-state imaging element 72 are connected through the bonding wires 75 are led out to external connection terminals disposed at the lower surface (bottom surface) or a side surface of the ceramic accommodating container 71 (the leading out of the electrodes to the external connection terminals is not shown).

Figure 2:
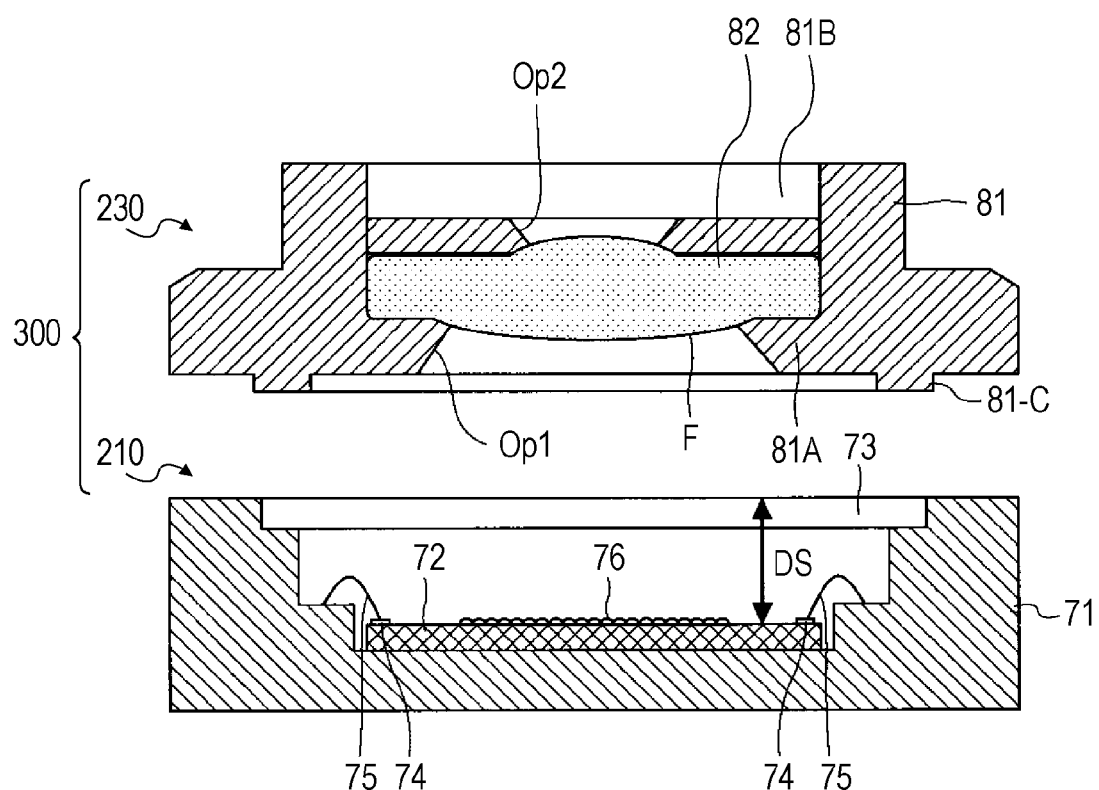
FIG. 2 is a sectional view of a camera module in which a lens unit is mounted to the solid-state imaging device depicted in FIGS. 1A and 1B.

FIG. 2 is a sectional view of a camera module in which a lens unit, which is a lens holder, is mounted to the solid-state imaging device 210. That is, a lens unit 230 is mounted to the solid-state imaging device 210 to form a camera module 300.

In the lens unit 230, for example, one lens, formed by a resin molding method, etc., is accommodated in a lens holder 81. The lens holder 81 in the lens unit 230 has an annular protrusion 81A that supports a lens 82. A tapering opening Op1 that widens from the lens 82 towards the principal surface of the solid-state imaging element 72 is provided in the bottom portion of the protrusion 81A (at a surface opposing the solid-state imaging element 72 in the solid-state imaging device 210).

An opening Op2 that widens outward from the lens is provided at a lens holding section 81B that is inserted to the upper side of the lens 82 and that presses and holds the lens 82. The lens holding section 81B also functions as a diaphragm. An annular affixing protrusion 81C for affixing to the principal surface of the ceramic accommodating container 71 is formed at a peripheral portion of the bottom portion of the lens holder 81.

The lens unit 230 and the solid-state imaging device 210 are integrally formed by affixing an end surface of the affixing protrusion 81C to the upper surface of the ceramic accommodating container 71. At this time, since the upper surface of the ceramic accommodating container 71 is substantially at the same height as the upper surface of the transparent member 73, the mounting/affixing of the lens unit is quickly performed.

In the first embodiment, of the outer surface of the transparent member 73 and the upper surface of the ceramic accommodating container 71 that is disposed in substantially the same plane as the outer surface of the transparent member 73, an area that does not influence the optical characteristics of the solid-state imaging element 72, such as a portion situated outward from a portion with which the affixing protrusion 81C of the lens unit contacts, is provided with origin adjustment marks 77 (see FIG. 1).

That is, the origin adjustment marks 77-1 to 77-4 are formed near the four corners of the upper surface of the ceramic accommodating container 71. All four origin adjustment marks 77 do not necessarily need to be disposed. At least one original adjustment mark is disposed.

Figure 3A:
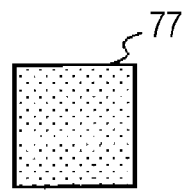
FIGS. 3A and 3B each depict an example of an origin adjustment mark.
Figure 3B:
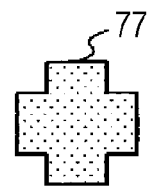

The origin adjustment marks 77 are used for aligning the ceramic accommodating container 71 with a lens of a test optical device (that is, for origin alignment) when inspecting the precision of the camera module 300. The origin adjustment marks 77 may be formed by, for example, a silk screen printing method or a laser seal method. The origin adjustment marks 77 may be circular, rectangular (see FIG. 3A), or cross-shaped (see FIG. 3B).

In the first embodiment, mounting-precision-inspection marks 78 are selectively disposed around the light-receiving area PA of the solid-state imaging element 72 (see FIG. 1).

That is, at the upper surface of the solid-state imaging element 72, the mounting-precision-inspection marks 78-1 to 78-4 are disposed near the four corners of the light-receiving area PA so as to be situated at outer sides of the rectangular light-receiving area PA (formed of the plurality of light-receiving elements).

The mounting-precision-inspection marks 78 are used for measuring whether the distance (indicated by a double-headed arrow DS in FIG. 1) between the upper surface of the solid-state imaging element and a surface where the lens unit 230 is disposed is a specific distance. The surface where the lens unit 230 is disposed corresponds to a surface with which the lens unit affixing protrusion 81C contacts (the vicinity of the outer edge of the upper surface of the transparent member 73 and/or the upper surface of the ceramic accommodating container 71).

The mounting-precision-inspection marks 78 are formed in, for example, a wafer process step when the solid-state imaging element 72 is formed or a step in which a color filter is formed on a light-receiving element section. The shapes of the mounting-precision-inspection marks 78 are not limited, so that they may be circular or may have concentric circular shapes. The sizes of the mounting-precision-inspection marks 78 are determined considering, for example, the wavelength of light used for inspection, the refractive index and the thickness of the transparent member 73, and the distance between the reference surface, formed at the outer surface (light-incident surface) of the transparent member 73, and the upper surface (light-receiving area) of the solid-state imaging element 72.

Further, in the first embodiment, transparent-member marks may be disposed at locations that do not influence the optical characteristics of the solid-state imaging element 72 at the upper surface and the lower surface of the transparent member 73. The transparent-member marks are used for confirming whether or not the thickness of the transparent member 73 matches a design value (reference value). The transparent-member marks may be formed when covering a surface of the transparent member 73 with a specific coating film. Alternatively, the transparent-member marks may be formed by a laser seal method. The shapes of the transparent-member marks are not limited, so that they may be circular, rectangular, or cross-shaped as with the origin adjustment marks 77.

Second Embodiment

Figure 4A:
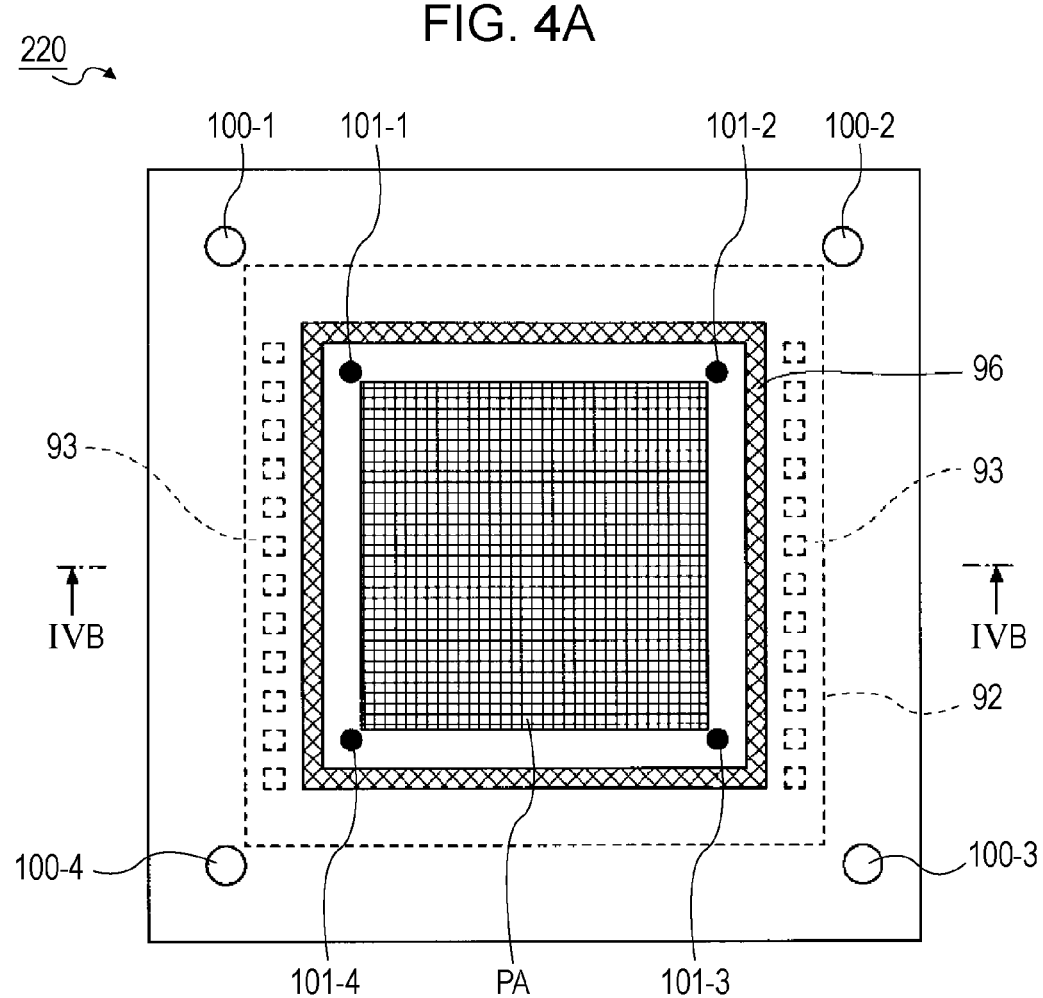
FIG. 4A is a sectional view of a solid-state imaging device according to a second embodiment.
Figure 4B:
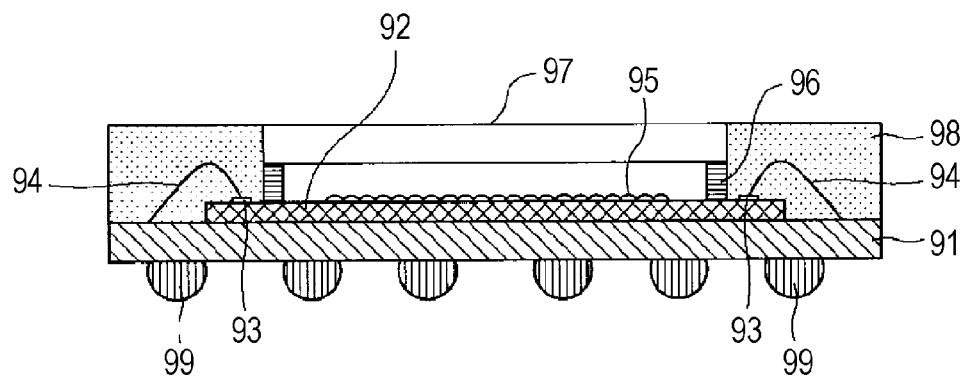
FIG. 4B is a sectional view taken along line IVB-IVB of FIG. 4A.

A solid-state imaging device 220 according to a second embodiment will be described with reference to FIGS. 4A and 4B. FIG. 4A is a plan view of the solid-state imaging device 220 according to the second embodiment. FIG. 4B is a sectional view taken along line IVB-IVB of FIG. 4A.

In the solid-state imaging device 220, a solid-state imaging element 92 is mounted/affixed to one of the principal surfaces of a wiring substrate 91 with a principal surface (a surface having a light-receiving area PA formed of a plurality of light-receiving elements) of the solid imaging element 92 facing upward.

Bonding wires 94 connect electrode pads 93 of the solid-state imaging element 92 to terminals (not shown), provided at a wiring substrate 91. A microlens 95 is disposed on the light-receiving elements constituting the light-receiving area PA of the solid-state imaging element 92. In FIG. 4A, the bonding wires 94 are not shown.

An adhesive material layer 96 having a specific height (thickness) is disposed on the principal surface of the solid-state imaging element 92 so as to form a wall around the light-receiving area PA. A transparent member 97, formed of a glass plate, is mounted/affixed to the upper surface of the adhesive material layer 96. The adhesive material layer 96 functions as a spacer between the solid-state imaging element 92 and the transparent member 97. A sealing resin 98, such as epoxy resin, seals the upper surface of the wiring substrate 91 so as to be situated at the outer peripheries of the adhesive material layer 96 and the transparent member 97.

At this time, the height of the upper surface of the sealing resin 98 is substantially the same as the height of the upper surface of the transparent member 97. The bonding wires 94 are also sealed with resin. As the sealing resin 98, silicon resin or acrylic resin may also be used.

External connection electrodes 99, formed of, for example, solder balls, are disposed at the other principal surface of the wiring substrate 91.

In such a structure, light transmitted through the transparent member 97 is incident upon the light-receiving area PA of the solid-state imaging element 92.

A lens holder, that is, the lens unit 230 depicted in FIG. 2 is mounted to the solid-state imaging device 220 to form a camera module. Here, a form in which the lens unit 230 is mounted is not shown.

Even in the second embodiment, at the upper surface of the sealing resin 98, origin adjustment marks 100 are disposed in an area that does not influence the optical characteristics of the solid-state imaging element 92, such as at outer sides of portions with which an affixing protrusion 81C of the lens unit 230 contacts. The origin adjustment marks 100-1 to 100-4 are disposed near the four corners of the upper surface of the sealing resin 98. At least one original adjustment mark 100 is disposed at a location that does not influence the optical characteristics of the solid-state imaging element 92. In addition, similar to the origin adjustment marks 77 depicted in FIG. 1 or FIG. 3, the origin adjustment marks 100 may be circular, rectangular, or cross-shaped.

Mounting-precision-inspection marks 101 are selectively disposed around the light-receiving area PA of the solid-state imaging element 92. At the solid-state imaging element 92, the mounting-precision-inspection marks 101-1 to 101-4 are disposed near the four corners of the light-receiving area so as to be situated at outer sides of the rectangular light-receiving area (formed of the plurality of light-receiving elements).

The mounting-precision-inspection marks 101 are used for measuring whether the distance (indicated by a double-headed arrow DS in FIG. 2) between a surface where the lens unit 230 is disposed and the upper surface of the solid-state imaging element 92 is a specific distance. The surface where the lens unit 230 is disposed corresponds to a surface with which the lens-unit affixing protrusion 81C contacts (the vicinity of the outer periphery of the upper surface of the transparent member 97 and/or the upper surface of the sealing resin 98).

The mounting-precision-inspection marks 101 are formed in, for example, a wafer process step when the solid-state imaging element 92 is formed or a step in which a color filter is formed on a light-receiving element section.

The shapes and sizes of the mounting-precision-inspection marks 101 may be similar to those in the first embodiment.

Even in the second embodiment, transparent-member marks may be disposed at areas that do not influence the optical characteristics of the solid-state imaging element 92 at the upper surface and the lower surface of the transparent member 97.

Next, a method of inspecting precision of the solid-state imaging device 210 or the solid-state imaging device 220 will be described.

Figure 5:
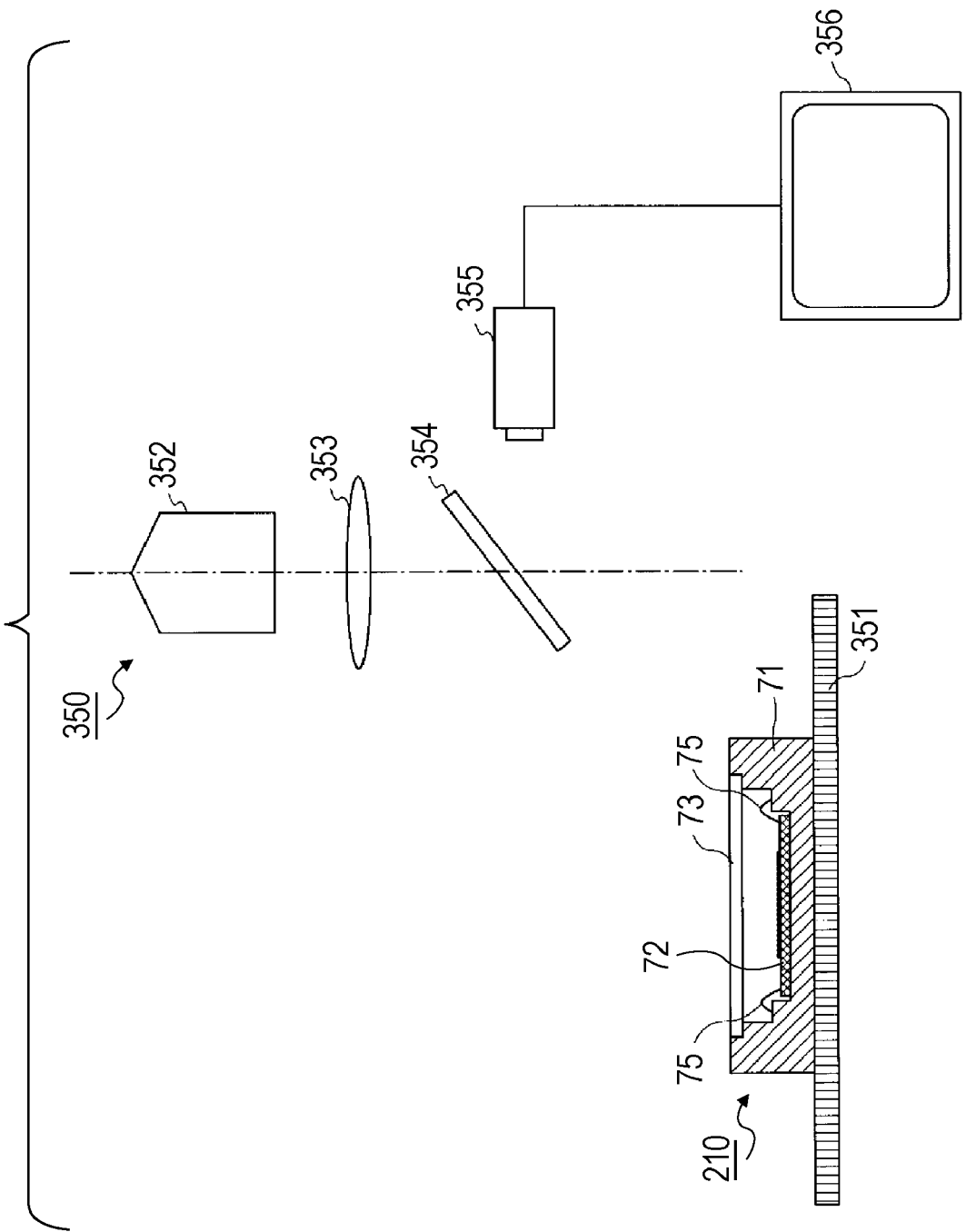
FIG. 5 illustrates a method of inspecting precision of the solid-state imaging device.

2. Method of Inspecting Precision of Solid-State Imaging Device and Method of Producing Solid-State Imaging Device Here, the method of inspecting precision of the solid-state imaging device 210 will be described with reference to FIGS. 5 to 7. The precision inspection method can be similarly applied to the solid-state imaging device 220.

First, an inspection a solid-state imaging device 210 to be inspected is disposed on a stage 351 of a measuring device 350. As shown depicted in FIG. 5, the measuring device 350 includes, for example, a light source 352, a condensing lens 353, and a half mirror 354, which are positioned above the stage 351.

In the measuring device 350, a light axis connecting the center of the light source 352 and a principal point of the condensing lens 353 is aligned with the center of the half mirror 354. The half mirror 354 is disposed so as to be tilted by a specific angle with respect to the light axis. That is, in the measuring device 350, measurement light emitted from the light source 352 passes through the condensing lens 353 and the half mirror 354, and illuminates a measurement object. Light reflected by the measurement object returns towards the light source 352. A portion of the light returning towards the light source 352 is reflected sideways by the half mirror 354, and is received by a camera 355. Then, an image is displayed on a monitor 356 connected to the camera 355.

In this method, the measuring device 350 is used in this way to, first, align the upper surface of the ceramic accommodating container 71 with the condensing lens 353 of the measuring device 350 (origin adjustment is carried out).

During the origin adjustment, first, the light axis of the measuring device 350 is aligned with one of the origin adjustment marks 77 disposed on the upper surface of the ceramic accommodating container 71.

As a result, a pattern of the origin adjustment mark 77 is received by the camera 355 through the half mirror 354 using ambient light, such as natural light. Then, the pattern form (such as a circular pattern 77P) is displayed on the monitor 356 connected to the camera 355.

Then, as depicted in FIG. 6, the origin adjustment mark 77 is irradiated with the measurement light by passing the measurement light through the condensing lens 353 and the half mirror 354 from the light source 352 of the measuring device 350.

The measurement light used for the irradiation is reflected by the origin adjustment mark 77, is reflected by the half mirror 354 and guided sideways, and is input into the camera 355. The monitor 356 displays a circular spot.

That is, in this state, the pattern of the origin adjustment mark 77 and a measurement-light pattern are displayed on the monitor 356 so as to be superposed upon each other.

The condensing lens 353 or the stage 351 is moved upward or downward so that the sizes of the two displayed light patterns superposed upon each other match each other, that is, so that the size of the light pattern used for the irradiation matches the size of the pattern of the origin adjustment mark 77.

When the size of the irradiation-light pattern matches the size of the pattern of the origin adjustment mark 77, the upper surface of the ceramic accommodating container 71 is aligned with the condensing lens 352 of the test optical device 350 (that is, origin adjustment is carried out).

As mentioned above, in the solid-state imaging device 210 depicted in FIG. 1, a plurality of origin adjustment marks 77 are disposed on the upper surface of the ceramic accommodating container 71. Therefore, comparing each origin adjustment mark 77 with the size of the irradiation-light pattern makes it possible to determine whether or not the upper surface of the ceramic accommodating container 71 is tilted.

Next, while the distance between the condensing lens 353 of the measuring device 350 and the upper surface of the ceramic accommodating container 71, which have been adjusted in the aforementioned step, is maintained, the stage 351 is moved in the direction of arrow N depicted in FIG. 7, so that light transmitted through the condensing lens 353 of the measuring device 350 passes through the transparent member 73 to irradiate the solid-state imaging element 72.

That is, the mounting-precision-inspection marks 78, disposed near the four corners of the light-receiving area PA so as to be situated at the outer sides of the light-receiving area PA of the solid-state imaging element 72, is irradiated with the measurement light.

During the origin adjustment and the irradiation of the solid-state imaging element with the light, the irradiation position of the irradiation light with respect to the processing solid-state imaging device to be processed can be changed by moving either the stage 351, on which the ceramic accommodating container 71 is disposed, or the optical system. Here, the example in which the stage 351 is moved is described.

The mounting-precision-inspection marks 78 are used for measuring whether or not the distance DS between the reference surface and the upper surface of the solid-state imaging element 72 is a specific value (reference value).

The sizes of the mounting-precision-inspection marks 78 are previously set considering, for example, the wavelength of light used, the refractive index and the thickness of the transparent member 73, and the distance between the upper surface of the solid-state imaging element 72 and the reference surface where the lens unit 220 is mounted (the upper outer surface of the transparent member 73 and the upper surface of the ceramic accommodating container 71).

The incident measurement light transmitted through the condensing lens 353, the half mirror 354, and the transparent member 73 is reflected by the mounting-precision-inspection marks 78, disposed on the upper surface of the solid-state imaging element 72, and returns towards the light source 351. A portion of the light returning towards the light source 351 is reflected sideways by the half mirror 354, and is received by the camera 355.

Then, an image is displayed on the monitor 356 connected to the camera 355. This allows the size of the pattern of the measurement irradiation light to be compared with the size of each mounting-precision-inspection mark 78.

Here, the relationship of the size of each mounting-precision-inspection mark 78 (displayed on the monitor 356) and the size of the pattern of the measurement light with the distance between the reference surface and the upper surface of the solid-state imaging element 72 will be described with reference to FIGS. 8A to 8C. Here, it is assumed that each mounting-precision-inspection mark 78 is circular, and the thickness of the transparent member 73 (where the solid-state imaging device 210 is provided) is a specific value (equal to a design value).

A case in which the size of the pattern of the reflected measurement light is essentially equal to the size of the mounting-precision-inspection mark 78 is depicted in FIG. 8A. In this case, it is determined that the distance between the reference surface and the upper surface of the solid-state imaging element 72 matches the design value.

In addition, a case in which the size of the pattern of the reflected measurement light is less than the size of the mounting-precision-inspection mark 78 is depicted in FIG. 8B. In this case, it is determined that the distance between the reference surface and the upper surface of the solid-state imaging element 72 is greater the design value.

Further, a case in which the size of the pattern of the reflected measurement light is greater than the size of the mounting-precision-inspection mark 78 is depicted in FIG. 8C. In this case, it is determined that the distance between the reference surface and the upper surface of the solid-state imaging element 72 is less than the design value.

Accordingly, the size of the pattern of the reflected measurement light varies depending upon the distance between the upper surface of the solid-state imaging element 72 and the reference surface where the lens unit 230 is mounted, that is, the surface with which the lower surface of the affixing protrusion 81C of the lens unit 230 contacts (the upper surface of the transparent member 73 and/or the upper surface of the ceramic accommodating container 71).

Therefore, as depicted in FIG. 9, when the mounting-precision-inspection mark 78 comprises concentric circles, it is possible to easily know the amount of deviation from a specific value of the distance between the upper surface of the solid-state imaging element 72 and the reference surface where the lens unit 83 is mounted.

For example, when the design value of the distance between the upper surface of the solid-state imaging element 72 and the lower surface of the affixing protrusion 81C of the lens unit 230 (the vicinity of the outer peripheral side of the upper surface of the transparent member 73 and the upper surface of the ceramic accommodating container 71) is 0.4 mm, the mounting-precision-inspection mark includes four concentric circles so that the mounting-precision-inspection mark can be used when the actual distances between the upper surface of the solid-state imaging element 72 and the reference surface where the lens unit 83 is mounted may be 0.5 mm, 0.4 mm, 0.3 mm, and 0.2 mm. The diameters of the concentric circles may be, from the center circle, 0.2 µm, 0.25 µm, 0.30 µm, and 0.35 µm.

The diameters of the concentric circles may be determined by calculation or actual measurement.

Figure 10A:
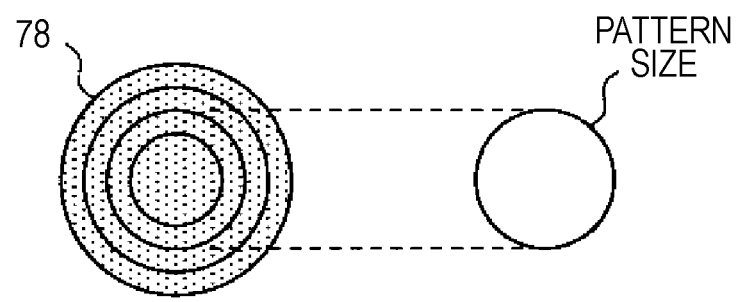
FIGS. 10A to 10C each depict the relationship between the mounting-precision-inspection mark depicted in FIG. 9 and the measurement-light pattern size.
Figure 10B:
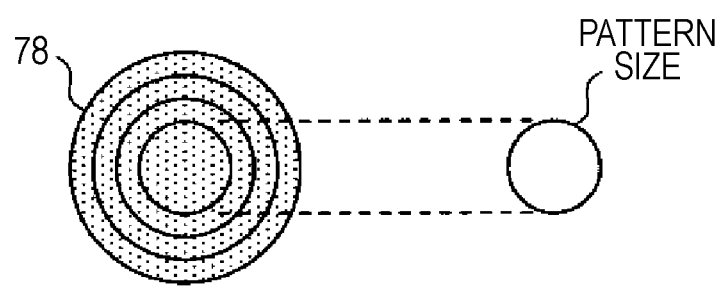
Figure 10C:
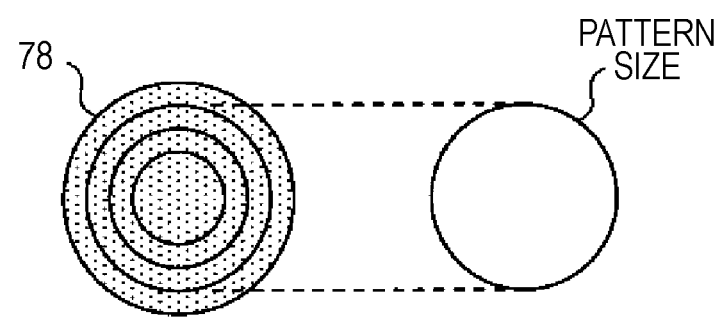

The relationship between the size of the pattern of the measurement light and the size of the mounting-precision-inspection mark 78 displayed on the monitor 356 when the mounting-precision-inspection mark 78 has concentric circles is depicted in each of FIGS. 10A to 10C.

Even here, it is assumed that the thickness of the transparent member 73 of the solid-state imaging device 210 is a specific value (design value).

As depicted in FIG. 10A, when the size of the pattern of the reflected measurement light is substantially equal to the size of the concentric circle having a diameter of 0.25 µm of the mounting-precision-inspection mark 78, it may be determined that the distance between the reference surface and the upper surface of the solid-state imaging element 72 is the design value of 0.4 mm.

As depicted in FIG. 10B, when the size of the pattern of the reflected measurement light is substantially equal to the size of the concentric circle having a diameter of 0.2 μm of the mounting-precision-inspection mark 78, it may be determined that the distance between the reference surface and the upper surface of the solid-state imaging element 72 is 0.5 mm, which is greater than the design value by 0.1 mm.

As depicted in FIG. 10C, when the size of the pattern of the reflected measurement light is substantially equal to the size of the concentric circle having a diameter of 0.3 μm of the mounting-precision-inspection mark 78, it may be determined that the distance between the reference surface and the upper surface of the solid-state imaging element 72 is 0.3 mm, which is less than the design value by 0.1 mm.

In general, the lens 82 used in the lens unit 230 depicted in FIG. 2 is formed by a resin molding method. The lens holder 81 may also be formed by the resin molding method. Therefore, in the lens unit 230, manufacturing variations may occur in a focal length or in a flange back, which is the distance between a lens mounting surface (that is, the location indicated by reference character F in FIG. 2) and the upper surface of the solid-state imaging element 72.

Therefore, in a process of producing the camera module in which the lens unit 230 is mounted to the solid-state imaging device 210, the distance between the reference surface and the upper surface of the solid-state imaging element 72 in each of a plurality of solid-state imaging devices 210 is previously compared with the design value (reference value).

For a solid-state imaging device 210 in which the distance between the reference surface and the upper surface of the solid-state imaging element 72 is greater than the design value, a lens unit 230 in which a lens whose focal length is greater than a focal length corresponding to the design value is mounted is used as a lens holder.

For a solid-state imaging device 210 in which the distance between the reference surface and the upper surface of the solid-state imaging element 72 is less than the design value, a lens unit 230 in which a lens whose focal length is less than a focal length corresponding to the design value is mounted may be used as a lens holder.

This makes it possible to produce camera modules with a high manufacturing yield, and to effectively use parts/materials to control manufacturing costs.

In particular, as depicted in FIG. 9, when the mounting-precision-inspection mark 78 comprises concentric circles, the difference between the design value and the distance between the reference surface and the upper surface of the solid-state imaging element 72 can be easily known. Therefore, a proper lens can be selected.

In the solid-state imaging device 210, the mounting-precision-inspection marks 78-1 to 78-4 are, as mentioned above, disposed near the four corners of the light-receiving area so as to be situated at the outer sides of the light-receiving area at the upper surface of the solid-state imaging element 72 (see FIG. 1A).

Therefore, by comparing the size of each of the mounting-precision-inspection marks 78-1 to 78-4 with the size of the pattern of the measurement light with which the mounting-precision-inspection marks 78-1 to 78-4 are irradiated through the condensing lens 353, it is possible to inspect whether or not the solid-state imaging element 72 and the reference surface where the lens unit 230 is mounted (that is, the upper surface of the transparent member 73) are disposed parallel to each other.

Figure 1B:
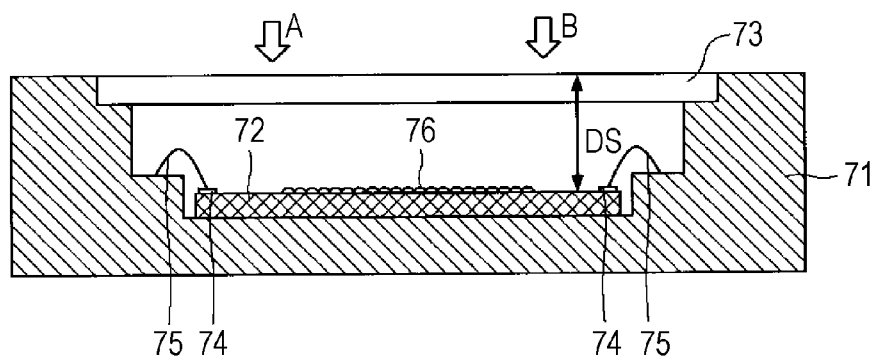
FIG. 1B is a sectional view taken along line IB-IB of FIG. 1A.
Figure 11A:
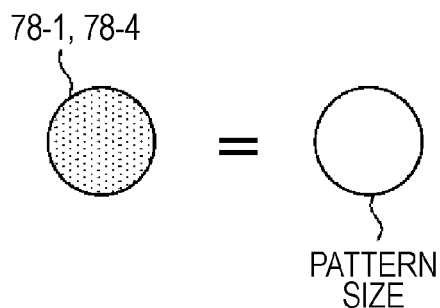
FIGS. 11A and 11B each illustrate a situation where it is determined that the reference surface is tilted with respect to the solid-state imaging element.

For example, at a location indicated by arrow A in FIG. 1B, as depicted in FIG. 11A, the size of the mounting-precision-inspection mark 78-1 or 78-4 is the same as the size of the pattern of the measurement light with which the mounting-precision-inspection mark 78-1 or 78-4 is irradiated through the condensing lens 353 of the test optical device 350.

Figure 11B:
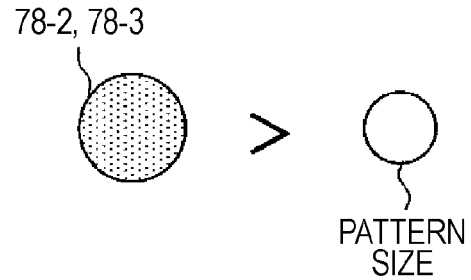

In contrast, at a location indicated by arrow B in FIG. 1B, as depicted in FIG. 11B, the size of the pattern of the measurement light with which the mounting-precision-inspection mark 78-2 or 78-3 is irradiated through the condensing lens 353 is less than the size of the mounting-precision-inspection mark 78-2 or 78-3. In such a case, it can be determined that the surface of the solid-state imaging element 72 and the upper surface of the transparent member 73 are not parallel to each other, and that the reference surface is tilted with respect to the solid-state imaging element 72. That is, the transparent member 73 is tilted with respect to the solid-state imaging element 72.

In other words, in this case, at the location indicated by the arrow A in FIG. 1B, the distance between the reference surface and the upper surface of the solid-state imaging element 72 is equal to the design value. In contrast, at the location indicated by the arrow B in FIG. 1B, the distance between the reference surface and the upper surface of the solid-state imaging element 72 is greater than the design value, so that it can be determined that the reference surface is such that the right side is higher than the left side (in FIG. 1A) with respect to the solid-state imaging element 72.

If the lens unit 230 is mounted when the reference surface is tilted with respect to the surface of the solid-state imaging element 72, the focal point of the lens 82 accommodated in the lens unit 230 does not match the light-receiving area PA of the solid-state imaging element 72. That is, a defective camera module is formed.

Such a detection of the distance between the surface of the solid-state imaging element and the reference surface and such a detection of parallelism are similarly carried out for the solid-state imaging device 220. That is, it is possible to compare the mark sizes with the size of the pattern of the measurement light using the origin adjustment marks 100 and the mounting-precision-inspection marks 101, which are depicted in FIG. 4A.

In addition, prior to mounting the lens holder, that is, mounting the lens unit 230 to the solid-state imaging device 220, the test device 350 is used to detect the distance between the surface where the lens unit 230 is mounted and the solid-state imaging element 92 of the solid-state imaging device 220, and determine the parallelism thereof. Based on the detection and determination results, a lens unit 230 having a focal length corresponding to that of the solid-state imaging device 220 is selected and used. Therefore, a manufacturing yield of camera modules using such a solid-state imaging device 220 may be considerably increased.

In the embodiment, it is assumed that the thickness of the transparent member, such as a glass plate, disposed at the solid-state imaging device is equal to a specific value (design value).

According to this method, as mentioned above, checking the size of the pattern of the measurement light makes it possible to detect whether or not the thickness of the transparent member is equal to the specific value (design value). Transparent-member marks having specific sizes are disposed at locations that do not influence the optical characteristics of the solid-state imaging element at the upper and lower surfaces (front surface and back surface) of the transparent member. Then, an inspection is carried out to determine whether or not the transparent member has a specific thickness (design thickness) based on the size of a pattern of measurement light with which the transparent-member marks on the upper surface (front surface) of the transparent member are irradiated, and based on the size of a pattern of measurement light with which the transparent-member marks at the lower surface (back surface) of the transparent member are irradiated as a result of the light passing through the transparent member.

This will be described with reference to FIGS. 12A and 12B.

Figure 12A:
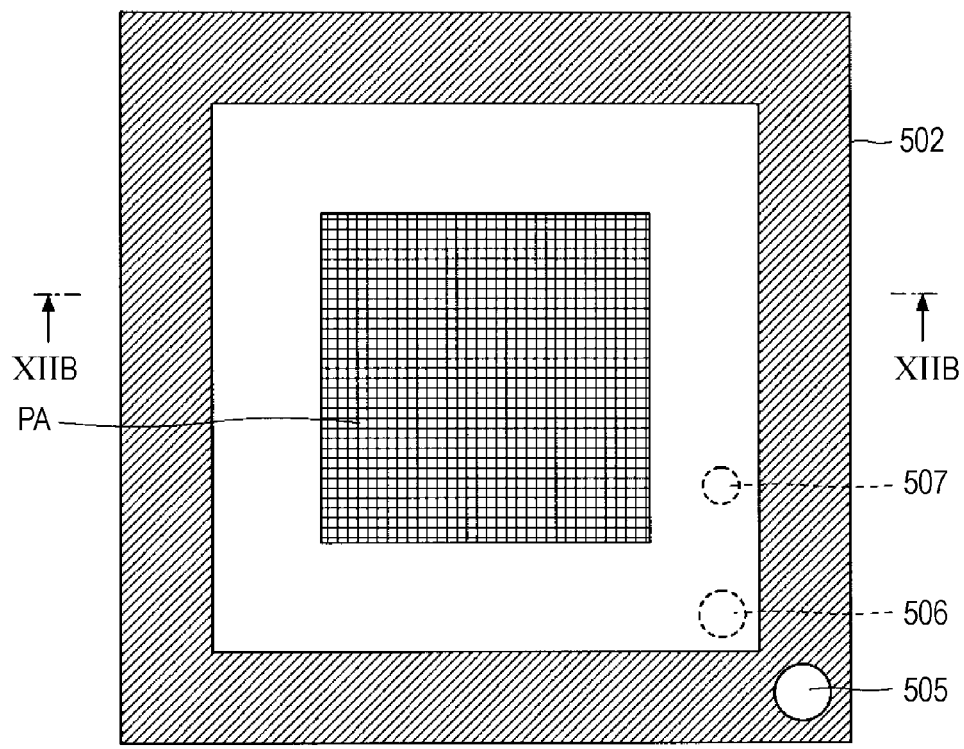
FIG. 12A is a plan view for illustrating a method of inspecting whether or not the thickness of a transparent member matches a design value.
Figure 12B:
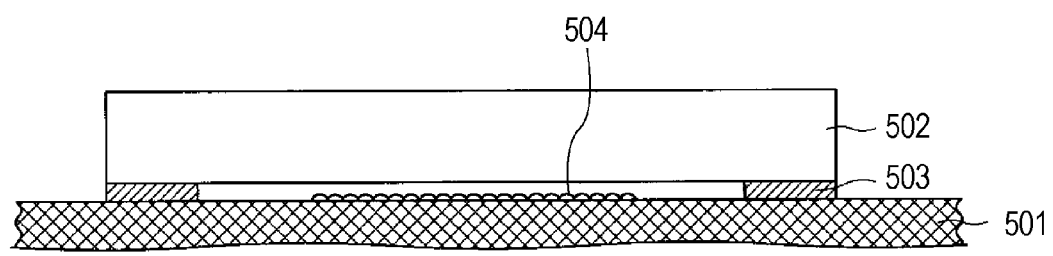
FIG. 12B is a sectional view illustrating the method of inspecting whether or not the thickness of the transparent member matches the design value.

FIGS. 12A and 12B each schematically depict a solid-state imaging element 501 and a transparent member 502 positioned above a light-receiving area of the solid-state imaging element 501. FIG. 12A is a plan view of the solid-state imaging device. FIG. 12B is a sectional view taken along line XIIB-XIIB of FIG. 12A.

In such a structure, an adhesive 503, serving as a spacer, is disposed between the solid-state imaging element 501 and the transparent member 502. The spacer and the adhesive may be separately disposed.

A light-receiving area PA of the solid-state imaging element 501 is formed of a plurality of light-receiving elements (photodiodes). A micro-lens 504 is disposed on the surface of the light-receiving area PA.

Here, a cut-out circular pattern 505 is disposed at an infrared-cut (IR) coating film provided on the upper surface of the transparent member 501. The pattern 505 has a specific diameter. In addition, an cut-out circular pattern 506 is disposed at an antireflection (AR) coating layer provided on the lower surface of the transparent member 501 (that is, the surface opposing the solid-state imaging element 501). The pattern 506 has a specific diameter.

Further, a circular pattern 507 may be disposed at the surface of the solid-state imaging element 501.

The circular patterns 505, 506, and 507 have different diameters corresponding to the sizes (design values) of the pattern of the measurement light. The diameter of the circular pattern 505 is greater than the diameter of the circular pattern 506 which is greater than the diameter of the circular pattern 507 in accordance with the distance from the condensing lens of the measuring device.

These circular patterns are disposed at different locations in a plane. The circular pattern 505 may be a colored pattern instead of the cut-out pattern.

First, measurement light transmitted through the condensing lens of the measuring device illuminates the circular pattern 505 disposed at the upper surface of the transparent member 502, so that the diameter of the spot of the measurement light matches the circular pattern 505. This sets the reference position.

Next, the measurement light illuminates the circular pattern 506 disposed at the lower surface of the transparent member 502, to detect whether or not the diameter of the spot of the measurement light matches the circular pattern 506.

At this time, when the diameter of the spot of the measurement light matches the circular pattern 506, it may be determined that the thickness (plate thickness) of the transparent member 502 is substantially equal to a specific thickness (design value).

If the diameter of the spot of the measurement light is greater than the circular pattern 506, it may be determined that the thickness of the transparent member 502 is less than the specific thickness (design value). In contrast, if the diameter of the spot of the measurement light is less than the circular pattern 506, it may be determined that the thickness of the transparent member 502 is greater than the specific thickness (design value).

Further, when it is detected that the diameter of the spot of the measurement light does or does not match the circular pattern 507 after the circular pattern 507, disposed at the upper surface of the solid-state imaging element 501, is irradiated with the measurement light, the distance between the upper surface of the solid-state imaging element 501 (that is, the surface where the light-receiving area is disposed) and the upper surface (outer surface) of the transparent member 502 can be detected.

Accordingly, it is possible to inspect whether or not the thickness of the transparent member 502 is a specific design value, so that it is possible to select a suitable lens unit that is in accordance with the actual thickness of the transparent member 502, as a lens provided in the lens unit.

Therefore, it is possible to reduce if not prevent the production of a camera lens in which an improper lens unit that is not in accordance with the thickness of the transparent member 502 is used.

The solid-state imaging device and the method of producing the solid-state imaging device, described here, are not limited to the above-described embodiments. Therefore various modifications and changes can be made. Although, in the above-described embodiment, the precision of the solid-state imaging device 210 is inspected as a result of irradiating, for example, the mounting-precision-inspection marks 78 of the solid-state imaging element 72 with light transmitted through the condensing lens 352 of the measuring device 350 and the transparent member 73 of the solid-state imaging device 210, the present invention is not limited as such. For example, diffused light serving as test light may be used as a result of changing the setting of the sizes of the mounting-precision-inspection marks 78.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A method of fabricating a solid-state imaging device, comprising:
   irradiating a first mark and a second mark with a light, the first mark being formed at a reference surface, the second mark being formed at an upper surface of a solid-state imaging element, the reference surface being either an upper surface of a transparent member disposed so as to oppose a light-receiving area of the solid-state imaging element, or an upper surface of a supporting member configured to support the transparent member; and
   detecting a distance between the reference surface and the upper surface of the solid-state imaging element by comparing a size of the first mark and a size of the second mark with respective sizes of spots of the light with which the first mark and the second mark are irradiated.

2. A method of fabricating a solid-state imaging device, comprising:
   positioning a reference surface using a first mark disposed at the reference surface, the reference surface being either an upper surface of a transparent member disposed so as to oppose a light-receiving area of a solid-state imaging element, or an upper surface of a supporting member configured to support the transparent member; and detecting a distance between the reference surface and an upper surface of the solid-state imaging element by irradiating a second mark with a light after positioning the reference surface, the second mark being disposed at an outer side of the light-receiving area, at the upper surface of the solid-state imaging element.

3. The method according to claim 2, wherein the distance between the reference surface and the upper surface of the solid-state imaging element is detected by comparing the second mark with a size of a spot of the light with which the second mark is irradiated.

4. The method according to claim 2, wherein, when a size of a spot of the light with which the second mark is irradiated is the same as a size of the second mark, the distance between the reference surface and the upper surface of the solid-state image pickup element is determined to be equal to a design value, wherein, when the size of the spot of the light with which the second mark is irradiated is less than the size of the second mark, the distance between the reference surface and the upper surface of the solid-state image pickup element is determined to be greater than the design value, and wherein, when the size of the spot of the light with which the second mark is irradiated is greater than the size of the second mark, the distance between the reference surface and the upper surface of the solid-state image pickup element is determined to be less than the design value.

5. The method according to claim 2, wherein positioning the reference surface includes:

irradiating the first mark with a light; and comparing a size of the first mark with a size of a spot of the light with which the first mark is irradiated.

6. The method according to claim 2, wherein the second mark includes a plurality of concentric circles, and wherein the distance between the reference surface and the upper surface of the solid-state imaging element is detected based on a difference between a size of at least one of the circles and a size of a spot of the light with which the second mark is irradiated.

7. The method according to claim 1, wherein a plurality of the second marks are formed at a first location and a second location of the upper surface of the solid-state imaging element, and wherein tilting of the solid-state imaging element with respect to the reference surface is determined based on a distance between the reference surface and the upper surface of the solid-state imaging element, determined at the first location, and a distance between the reference surface and the upper surface of the solid-state imaging element, determined at the second location.

8. The method according to claim 2, wherein a plurality of the second marks are formed at a first location and a second location of the upper surface of the solid-state imaging element, and wherein tilting of the solid-state imaging element with respect to the reference surface is determined based on a distance between the reference surface and the upper surface of the solid-state imaging element, determined at the first location, and a distance between the reference surface and the upper surface of the solid-state imaging element, determined at the second location.

9. The method according to claim 1, wherein a plurality of the first marks are formed at a first location and a second location of the reference surface, and wherein tilting of the reference surface is detected by comparing sizes of the first marks and sizes of spots of the light with which the first marks are irradiated at the first location and the second location.

10. The method according to claim 2, wherein a plurality of the first marks are formed at a first location and a second location of the reference surface, and wherein tilting of the reference surface is detected by comparing sizes of the first marks and sizes of spots of the light with which the first marks are irradiated at the first location and the second location.

11. The method according to claim 1, further comprising detecting a thickness of the transparent member by comparing sizes of a plurality of third marks with sizes of spots of light with which the third marks are irradiated, the third marks being formed at the upper surface and a lower surface of the transparent member.

12. The method according to claim 2, further comprising detecting a thickness of the transparent member by comparing sizes of a plurality of third marks with sizes of spots of light with which the third marks are irradiated, the third marks being formed at the upper surface and a lower surface of the transparent member.

13. The method according to claim 1, further comprising mounting an optical component to the transparent member based on the distance between the reference surface and the upper surface of the solid-state imaging element.

14. The method according to claim 2, further comprising mounting an optical component to the transparent member based on the distance between the reference surface and the upper surface of the solid-state imaging element.

* * * * *